United States Patent
Aizawa

[11] Patent Number: 5,818,226
[45] Date of Patent: Oct. 6, 1998

[54] MAGNETIC SENSOR HAVING A COIL WITH VARYING TURNS ALONG THE LENGTH OF A BOBBIN

[75] Inventor: Manabu Aizawa, Miyagi, Japan

[73] Assignee: Sony Corporation, Tokyo, Japan

[21] Appl. No.: 722,614

[22] Filed: Sep. 27, 1996

[30] Foreign Application Priority Data

Sep. 29, 1995 [JP] Japan .................................. 7-254241

[51] Int. Cl.⁶ .............................. G01R 33/02; H01F 5/02; H01F 27/28
[52] U.S. Cl. ........................ 324/258; 324/260; 336/198; 336/221; 336/225
[58] Field of Search .................................. 324/345, 346, 324/173, 207.15, 207.16, 213, 234, 239, 240, 244, 249, 253–258, 260; 336/196–198, 223, 231, 208, 221, 222, 225; 33/361

[56] References Cited

U.S. PATENT DOCUMENTS

| | | | |
|---|---|---|---|
| 2,159,534 | 5/1939 | Ruska | 336/225 |
| 2,436,394 | 2/1948 | Maltby et al. | 324/258 X |
| 2,927,266 | 3/1960 | Richter | 336/221 X |
| 3,546,580 | 12/1970 | Williams | 324/258 |
| 3,641,587 | 2/1972 | Virsberg | 336/231 X |
| 3,784,946 | 1/1974 | Bingen et al. | 336/231 X |
| 4,388,568 | 6/1983 | Goseberg et al. | 336/208 X |
| 4,884,028 | 11/1989 | Kozlov et al. | 324/213 |

*Primary Examiner*—Gerard R. Strecker
*Attorney, Agent, or Firm*—Hill & Simpson

[57] ABSTRACT

A magnetic sensor includes an elongated magnetic core and a coil wound on the periphery of the magnetic core so as to detect a magnetic field based on the change of inductance of the coil with high sensitivity and without increasing the number of turns of the coil. The number of turns of the coil in the central part of the magnetic core is larger than that of the coil at the end parts of the magnetic core. Thus, a bias field due to a bias current supplied to the coil is efficiently applied to the magnetic core. As a result, the inductance of the coil can be set to a large value without increasing the number of turns of the coil and a high sensitivity can be obtained.

11 Claims, 8 Drawing Sheets

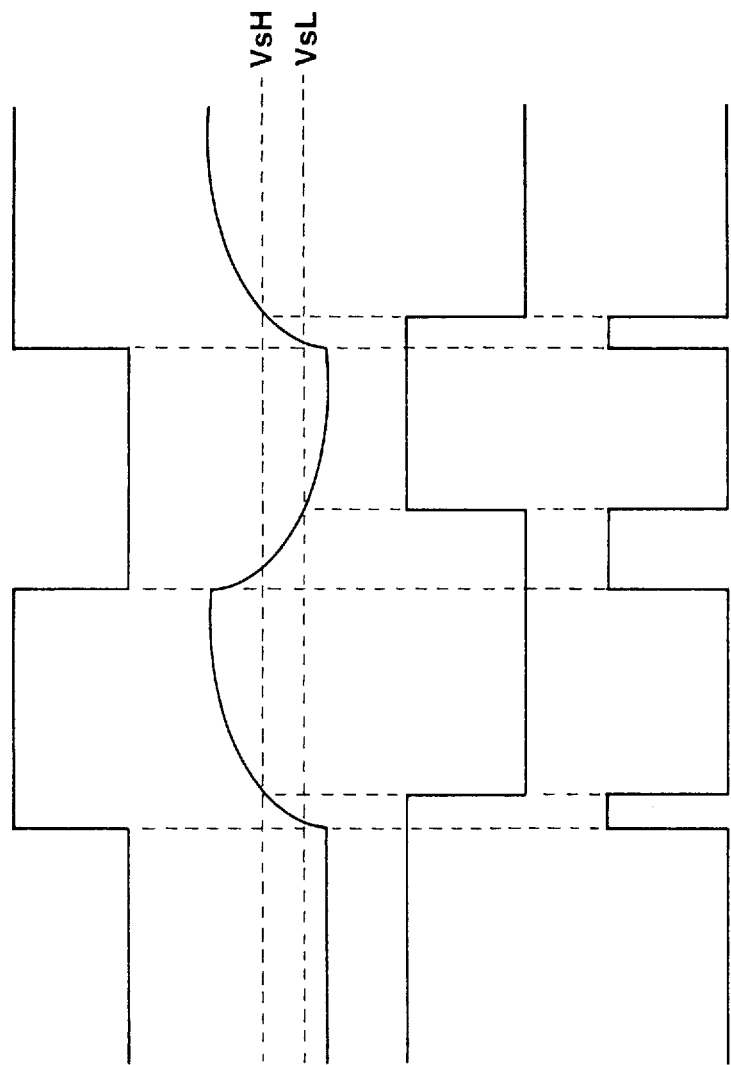

MAGNETIC SENSOR HAVING A COIL WITH VARYING TURNS ALONG THE LENGTH OF A BOBBIN

BACKGROUND OF THE INVENTION

1. Field of the Invention

The present invention relates to a magnetic sensor having a magnetic core made from a ferromagnetic material on which a coil is wound in order to detect an external magnetic field depending on the change of inductance.

2. Description of Prior Art

A magnetic sensor for detecting an external magnetic field has been initially used for a measurement such as a detector or a measuring equipment for a magnetic field, and, in recent years, has been widely employed for a magnetic rotary encoder, a geomagnetic sensor or the like.

Conventionally, as such a magnetic sensor mentioned above, a magnetic sensor using a Hall element, a magnetic sensor using a flux gate sensor, a magnetic sensor using a magneto-resistance effect element and the like has been utilized. However, these magnetic sensors have been extremely low in their sensitivity. Therefore, they have been disadvantageously incomplete to detect a very small and weak magnetic field such as geomagnetism, or failed to make their sizes small or lower their costs.

On the other hand, nowadays, a magnetic sensor utilizing the rapid conversion in the magnetic permeability of a ferromagnetic material has been developed as such a magnetic sensor in which a small size and low cost can be realized and high sensitivity can be obtained. The magnetic sensor of this kind includes, as can be seen in FIG. 1, a magnetic core 201 formed with an elongated ferromagnetic material and a coil 202 wound on the periphery of the magnetic core. The magnetic sensor is designed to detect the change of an external magnetic field by detecting the change of the inductance of the coil 202. Specifically, in such a magnetic sensor, when the external magnetic field is changed, the magnetic permeability of the magnetic core 201 is changed. As a result, a change is generated in the inductance of the coil 202. Thus, the change in the inductance of the coil 202 is detected, so that the change of the external magnetic field can be detected.

Generally, when the external magnetic field is detected by the magnetic sensor mentioned above, it has been necessary to supply bias current to the coil 202, apply bias magnetic field to the magnetic core 201 and magnetize the magnetic core 201 in its longitudinal direction, in order to obtain its high sensitivity and maintain its lineality at the time of detection of the external magnetic field. In this case, the bias current is preferably decreased so that a consumed power can be suppressed. Particularly, since control of the consumed power to a low value is a significant problem when the magnetic sensor is driven by using a battery, it has been desired to decrease the bias current. Additionally stated, the inductance of the coil 202 needs to be set more highly to improve the sensitivity of the magnetic sensor.

Therefore, with the magnetic sensor currently put into practice, the number of turns of the coil 202 is increased to reach about 1500 turns, in order to satisfy the above mentioned conditions. The number of turns of the coil 202 is increased in this way, so that the magnetic core 201 can be completely magnetized with little bias current, and the number of magnetic fluxes interlinking with the coil 202 is increased, thereby the value of inductance of the coil 202 being increased.

In the meantime, since the magnetic core forms an open magnetic circuit in such a magnetic sensor, magnetic poles exist in the magnetic core so that a diamagnetic field is produced therein. Thus, when there is a diamagnetic field in the magnetic core, an external magnetic flux hardly enters the magnetic core. Therefore, the diamagnetic field inconveniently applies adverse effects to the characteristic of the magnetic sensor.

Further, the influence of such a diamagnetic field generally becomes large, as the ratio of length to width of a magnetic material, that is, the aspect ratio grows small. Accordingly, the aspect ratio of the magnetic core may be increased simply from the viewpoint of reducing the adverse effects of the diamagnetic field, however, according to the magnetic sensor mentioned above, the aspect ratio needs to be set to a value as small as 15 so that the sharp change of the inductance can be advantageously employed.

In the past, for overcoming the above described problems encountered in the conventional magnetic sensor, when the efficiency of the magnetic sensor is raised and its sensitivity is improved, the number of turns of the coil has been increased in place of increasing the aspect ratio of the magnetic care.

However, when the number of turns of the coil is increased, there have been encountered problems that the size of the magnetic sensor is enlarged, or the cost of winding is raised, and so on. In addition, since the resistance of the coil ordinarily increases when the number of turns of the coil is increased, there arises a problem that a sufficient bias magnetic field may not be applied to the magnetic core when the magnetic sensor is driven by using a low voltage power source such as a commonly used battery.

OBJECT AND SUMMARY OF THE INVENTION

Accordingly, the present invention has been proposed by considering the above described circumstances and it is an object of the invention to provide a magnetic sensor in which a high sensitivity can be obtained without increasing the number of turns of a coil.

A magnetic sensor of the present invention which has been completed to achieve the above described object includes an elongated magnetic core and a coil wound on the periphery of the magnetic core, wherein the number of turns of the coil in the central part of the magnetic core is larger than that at the end parts of the magnetic core.

In the magnetic sensor constructed as described above, the stronger a magnetic field, the larger the influence of a diamagnetic field. In other words, therefore, the influence of the diamagnetic field becomes large in the vicinity of magnetic poles where the magnetic field is concentrated, that is, the influence becomes large at both the end parts of the magnetic core and becomes small in the central part of the magnetic core. In the magnetic sensor according to the present invention, since the number of turns of the coil is increased in the central part of the magnetic core, a stronger bias magnetic field is applied to the central part of the magnetic core to which the influence of the diamagnetic field is seldom applied. Therefore, with the magnetic sensor according to the present invention, the bias magnetic field can be efficiently applied to the magnetic core by virtue of a bias current supplied to the coil.

BRIEF DESCRIPTION OF THE DRAWINGS

FIGS. 12A, 12B, 12C and 12D are views showing the time charts of voltage waveforms in the respective parts of the magnetic field detecting circuit shown in FIG. 11.

DETAILED DESCRIPTION OF THE INVENTION

Referring to the accompanying drawings, an embodiment of the present invention will be described in detail hereinafter. It will be understood that the present invention is not limited to the below mentioned embodiment, and can be changed or modified without departing the scope of the gist of the invention.

Figure 1:
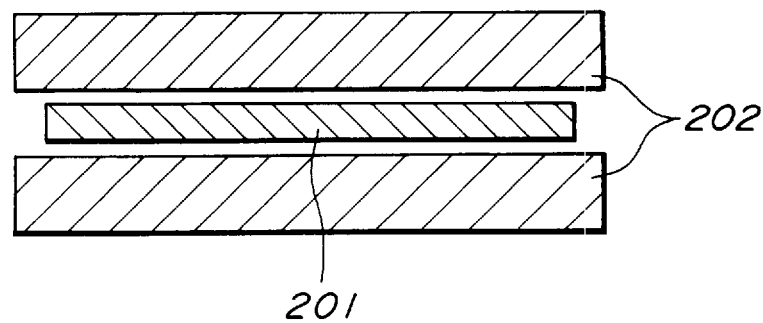
FIG. 1 is a schematic view showing an example of a conventional magnetic sensor.
Figure 2:
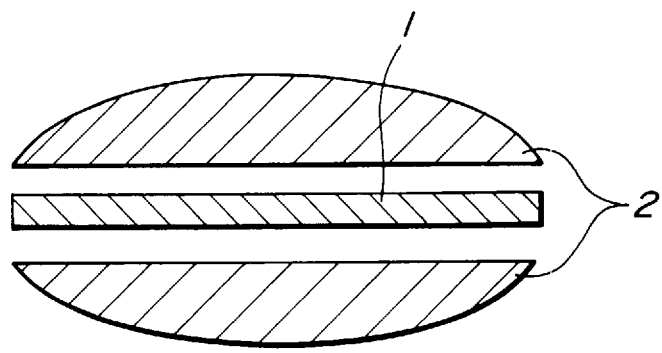
FIG. 2 is a schematic view showing an example of a convex magnetic sensor according to an embodiment of a magnetic sensor of the present invention.

A magnetic sensor according to an embodiment of the present invention is illustrated in its longitudinal section in FIG. 2. As can be seen in FIG. 2, the magnetic sensor includes an elongated magnetic core 1 formed in the shape of a ribbon or a wire and a coil 2 made of a copper wire wound in the longitudinal direction of the magnetic core 1.

Figure 3:
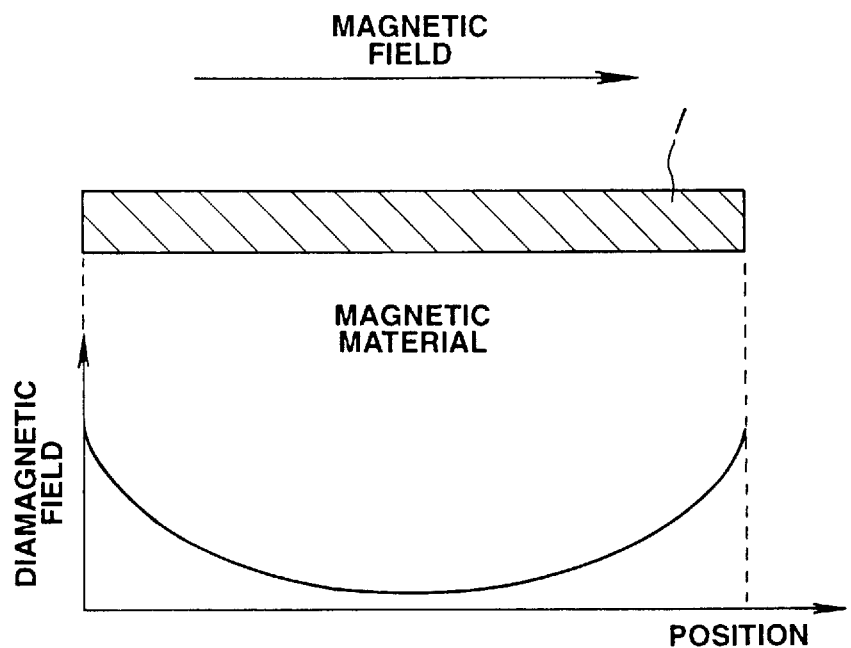
FIG. 3 is a view showing the distribution of a diamagnetic field in a magnetic core in a uniform magnetic field.

The magnetic core 1 is formed with a ferromagnetic material such as an amorphous material which is excellent in remanence characteristic so that the magnetic permeability is sharply changed even with a weak magnetic field of about several gausses. Then, when such a magnetic core 1 is arranged in a uniform magnetic field, the distribution of a diamagnetic field produced in the magnetic core 1 is increased, as illustrated in FIG. 3, in the vicinity of magnetic poles to which the magnetic field is concentrated, that is, at both the end parts of the magnetic core 1.

In the meantime, the coil 2 provided on the magnetic core 1 is wound so as to swell in the central part of the magnetic core 1, so that the number of turns of the coil in the central part of the magnetic core 1 is larger than that at the end parts of the magnetic core 1. (The magnetic sensor having the coil wound in the manner described above will be referred to as a "convex magnetic sensor", hereinafter)

If the number of turns of the coil 2 in the central part of the magnetic core 1 is made larger than that of the coil 2 at the end parts of the magnetic core 1 as stated above, when a bias current is supplied to the coil 2 so that a bias magnetic field is applied to the magnetic core 1, a stronger bias magnetic field is applied to the central part of the magnetic core 1 to which the influence of the diamagnetic field is seldom applied. Consequently, in the convex magnetic sensor, the bias magnetic field caused by the bias current supplied to the coil is efficiently applied to the magnetic core 1.

Figure 5:
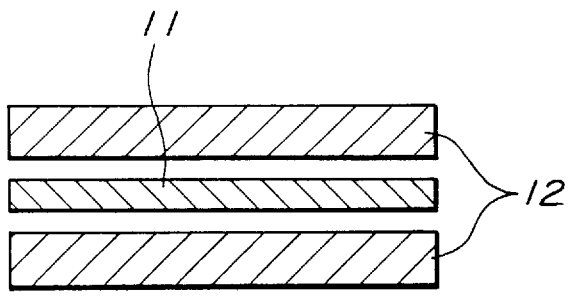
FIG. 5 is a schematic view showing an example of a regular coil forming magnetic sensor.
Figure 4:
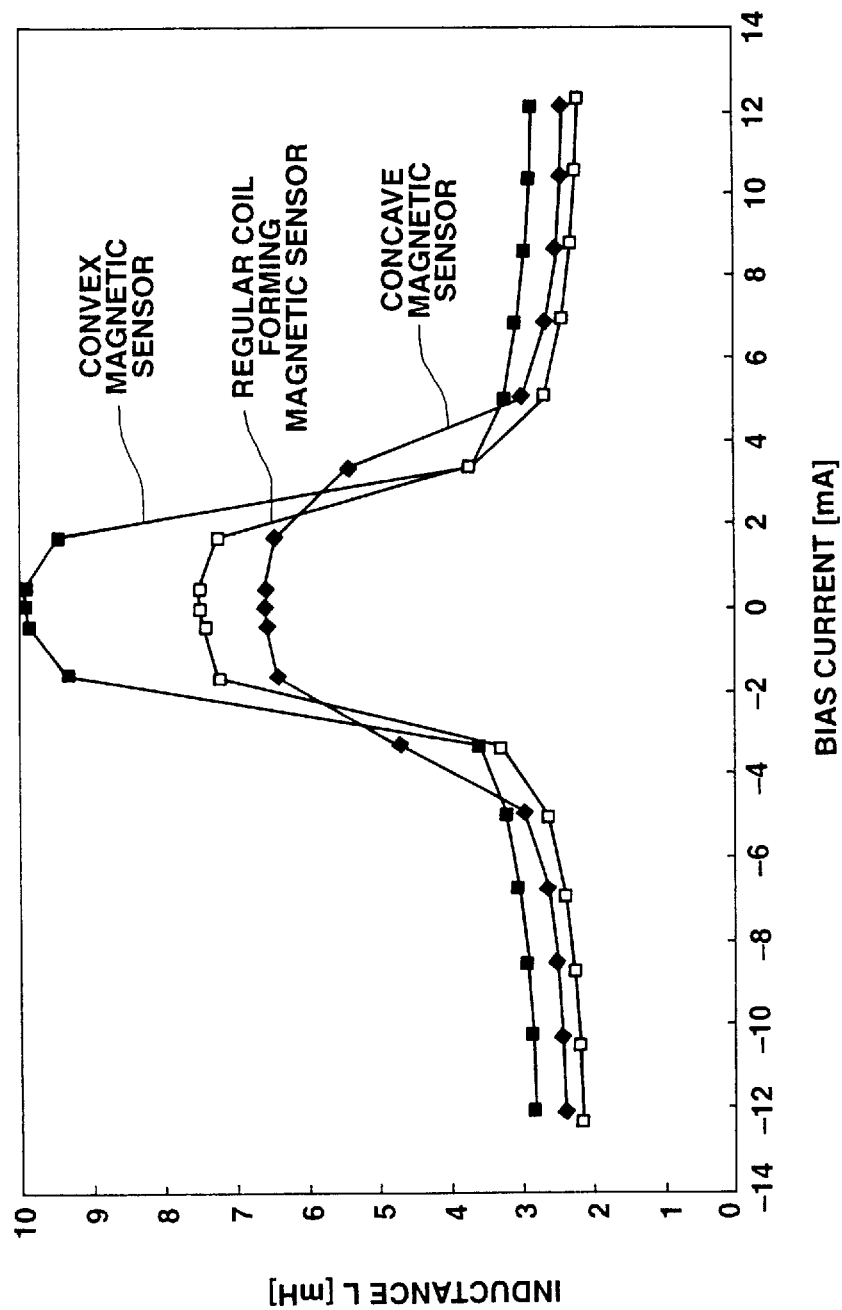
FIG. 4 is a characteristic view showing the relation between a bias current and inductance.
Figure 6:
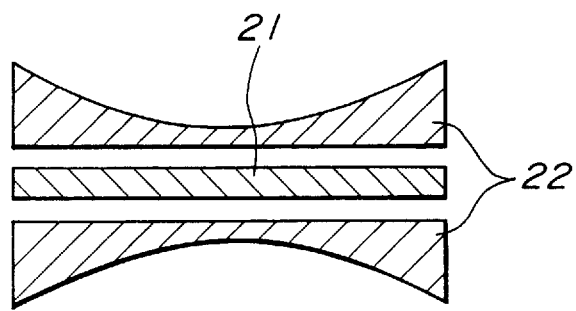
FIG. 6 is a schematic view showing an example of a concave magnetic sensor.

The above mentioned convex magnetic sensor is actually manufactured and the results of measured characteristics thereof are illustrated in FIG. 4. In FIG. 4, a horizontal line shows the values of the bias current supplied to the coil and a vertical line shows the values of the inductance of the coil. In FIG. 4, the characteristics of two other magnetic sensors are also illustrated for comparison with the convex magnetic sensor shown in FIG. 2. One of the two magnetic sensors, as shown in FIG. 5, is a magnetic sensor formed in such a manner that a coil 12 is uniformly wound on the whole part of a magnetic core 11 and the number of turns of the coil 12 in the central part of the magnetic core 11 is the same as that of the coil 12 at the end parts of the magnetic core 11 (The magnetic sensor on which the coil is wound in such a way will be referred to as a "regular coil forming magnetic sensor"). The other of the two magnetic sensors is, as illustrated in FIG. 6, is formed in such a manner that a coil 22 is wound on a magnetic core 21 to swell at both the end parts of the magnetic core 21 and the number of turns of the coil 22 in the central part of the magnetic core 21 is smaller than that of the coil 22 at the end parts of the magnetic core 21 (The magnetic sensor on which the coil is wound as explained above will be referred to as a "concave magnetic sensor". Herein, it is assumed that the magnetic cores and the numbers of turns of the coils of the magnetic sensors used for measuring these characteristics are respectively equal to one another.

As apparent from FIG. 4, although the number of turns of the coil in the convex magnetic sensor according to an embodiment of the present invention is the same as those of the regular coil forming magnetic sensor and the concave magnetic sensor, the change of the inductance in the convex magnetic sensor is larger than those of two other magnetic sensors. This phenomenon arises, as described above, because the bias magnetic field caused by the bias current supplied to the coil in the convex magnetic sensor is efficiently applied to the magnetic core. Additionally, in such a magnetic sensor, since an external magnetic field is detected based on the change of the inductance, the convex magnetic sensor having the large change in its inductance can detect the external magnetic field with an extremely excellent sensitivity without increasing the number of turns of the coil.

Figure 7:
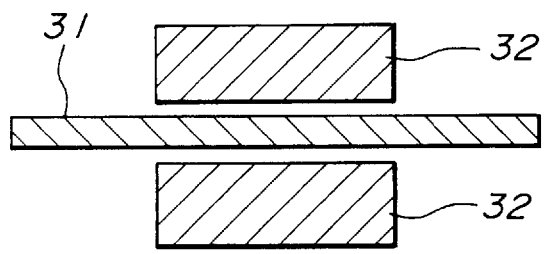
FIG. 7 is a schematic view showing an example of a coil length specified magnetic sensor according to the embodiment of the magnetic sensor of the present invention.

According to the convex magnetic sensor, the coil is wound on the magnetic core so as to swell in the central part of the magnetic core and the number of turns of the coil in the central part of the magnetic core is designed to be larger than that of the coil at the end parts of the magnetic core. However, as shown in FIG. 7, the length of a part on which a coil 32 is wound may be specified, the coil 32 be wound only on the central part of a magnetic core 31 and not be wound on the end parts of the magnetic core 31. (A magnetic sensor on which the coil is wound in such a manner will be referred to as a "coil length specified magnetic sensor", hereinafter.)

Also in the above stated coil length specified magnetic sensor, when a bias current is supplied to the coil 32 so that a bias magnetic field is applied to the magnetic core 31, a stronger bias magnetic field is applied to the central part of the magnetic core 31 to which the influence of a diamagnetic field is little applied. Consequently, also in the coil length specified magnetic sensor, the bias magnetic field owing to the bias current supplied to the coil 32 can be efficiently applied to the magnetic core 31.

Figure 8:
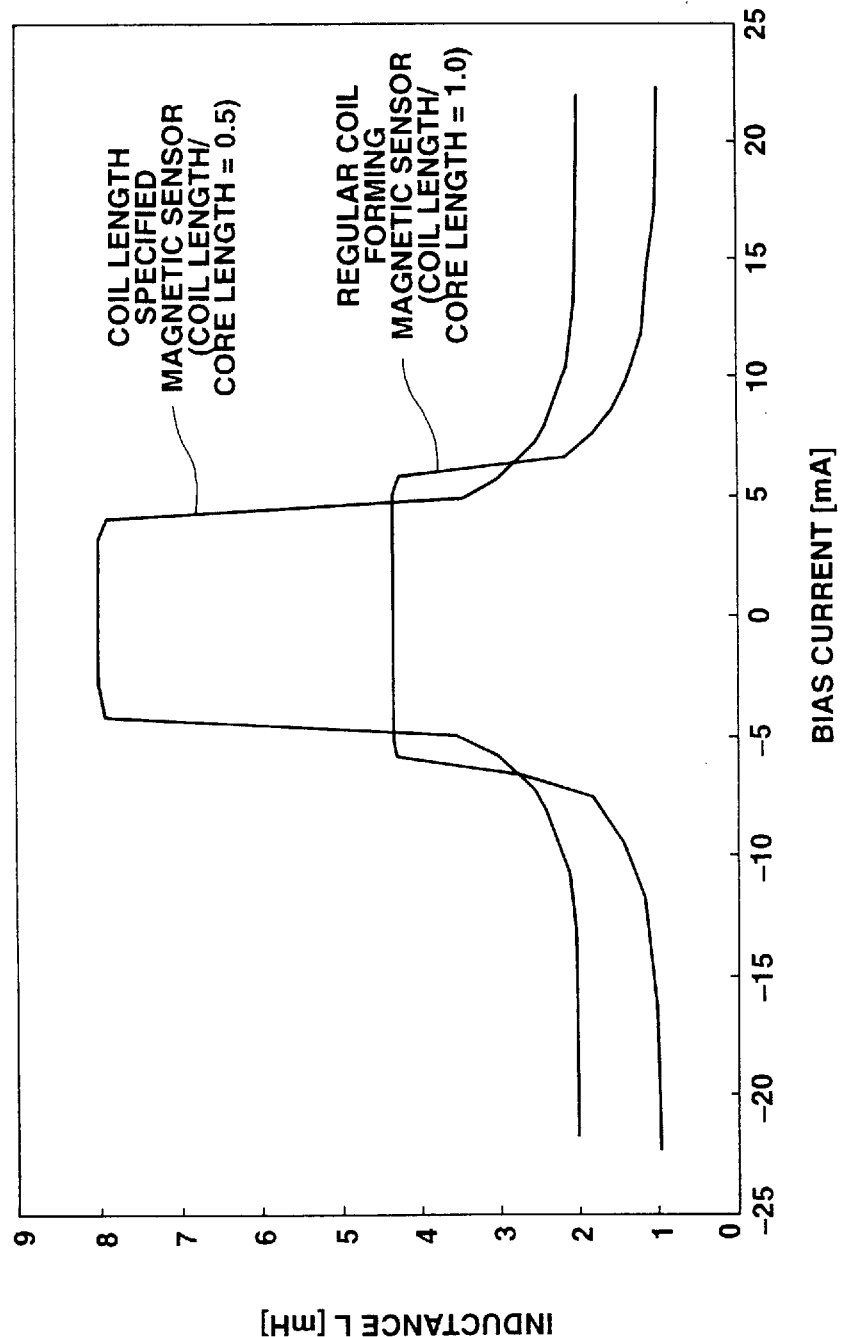
FIG. 8 is a characteristic view showing the relation between a bias current and inductance.

The above mentioned coil length specified magnetic sensor is actually manufactured and the results of measurement of its characteristic are illustrated in FIG. 8. In FIG. 8, a horizontal line shows the values of a bias current supplied to the coil and a vertical line shows the values of the inductance of the coil. Further, in FIG. 8, the characteristics of the regular coil forming magnetic sensor as seen in FIG. 5 are also displayed to be compared with the former. In this case, while the coil length specified magnetic sensor is manufactured in such a manner that the length of the part on which the coil is wound is a half of the length of the magnetic core, the regular coil forming magnetic sensor is manufactured in such a manner that the length of the part on which the coil is wound is the same as that of the magnetic core. It is assumed that the magnetic cores and the numbers of turns of the coils in these magnetic sensors which are employed for measurement of their characteristics are respectively equal to each other.

As can be seen from FIG. 8, in the coil length specified magnetic sensor according to the embodiment of the present invention, although the number of turns of the coil of the length specified magnetic sensor is the same as that of the regular coil forming magnetic sensor, the change of inductance of the former is larger than that of the latter. This phenomenon arises, as mentioned above, because the bias magnetic field caused by the bias current supplied to the coil is efficiently applied to the magnetic core in the coil length specified magnetic sensor. Further, since such a magnetic sensor detects an external magnetic field based on the change of its inductance, the coil length specified magnetic sensor having large change in its inductance can detect the external magnetic field with an extremely high sensitivity.

In addition, a magnetic sensor according to the present invention may include a structure in which a coil is wound on a bobbin and a magnetic core is inserted into the bobbin. In this case, when a bobbin is used, a bobbin whose central part is formed in a bound or thinned shape is preferably used. If the bobbin whose central part is thinned in such a way is used, the coil can be easily wound on the magnetic core so that the number of turns of the coil in the central part is increased more than that of the coil at the end parts of the magnetic core.

Exemplified examples of a magnetic sensor using the bobbin compressed in its central part as mentioned above are shown in FIGS. 9 and 10.

Figure 9:
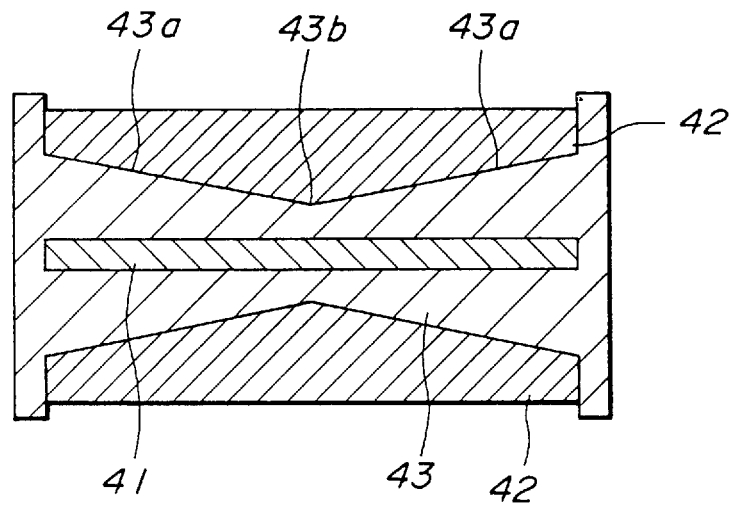
FIG. 9 is a schematic view showing another example of the magnetic sensor according to the embodiment of the present invention.

A bobbin 43 employed in a magnetic sensor illustrated in FIG. 9 has its inner periphery gradually reduced from the end parts 43a of the bobbin 43, that is, from parts corresponding to the end parts of a magnetic core 41 to the central part 43b of the bobbin 43, that is, to the central part of the magnetic core 41. When such a bobbin 43 is used, a coil 42 is wound on the bobbin 42 so that the outer periphery of the coil 42 on the bobbin is formed in a flat shape (i.e., presents a uniform outer periphery diameter along the longitudinal direction of the bobbin).

Thus, the number of turns of the coil 42 in the central part of the magnetic core 41 is larger than that of the coil 42 at the end parts of the magnetic core 41. Therefore, in the case of the magnetic sensor using the above mentioned bobbin 43, the coil 42 can be remarkably readily wound on the bobbin so that the number of turns of the coil 42 in the central part of the magnetic core 1 becomes larger than that of the coil 42 at both the end parts of the magnetic core 41. Furthermore, since the above mentioned magnetic sensor has the coil 42, wound on the bobbin, whose outer periphery is flat (i.e., it exhibits no ridges or dips), it can be conveniently easily handled.

Figure 10:
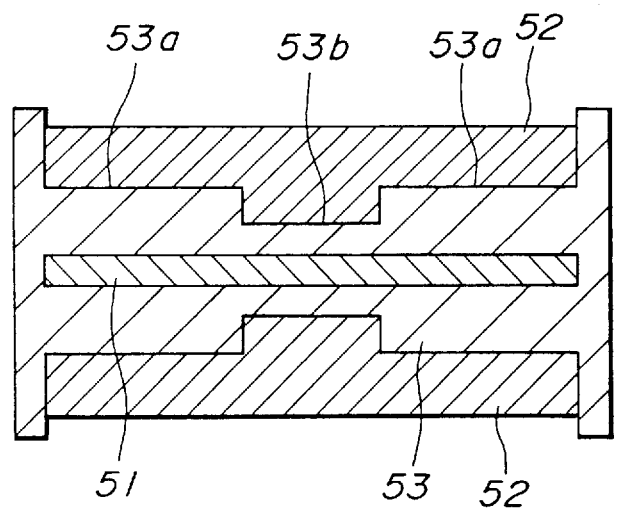
FIG. 10 is a schematic view showing another example of the magnetic sensor according to the embodiment of the present invention.

In the meantime, a bobbin 53 used for a magnetic sensor shown in FIG. 10 is provided with a recessed part in its central part so that the inner periphery of the central part 53b of the bobbin 53, that is, a part corresponding to the central part of a magnetic core 51 becomes smaller than the end parts 53a of the bobbin 53, that is, end parts corresponding to the end parts of the magnetic core 51.

When the bobbin 53 constructed as mentioned above, a coil 52 may be wound on the bobbin 53 so that the outer periphery of the coil 52 wound on the bobbin is formed in a flat shape. Thus, the number of turns of the coil 52 in the central part of the magnetic core 51 becomes larger than that of the coil 52 at both the end parts of the magnetic core 51. Therefore, with the magnetic sensor using such a bobbin 53, the coil 52 can be extremely easily wound on the bobbin 53 so that the number of turns of the coil 52 in the central part of the magnetic core 51 is increased more than that of the coil 52 at both the end parts of the magnetic core 51. Besides, since the outer periphery of the coil 52 wound on the bobbin 53 is flat in the magnetic sensor as mentioned above, the handling of the magnetic sensor is conveniently facilitated.

Now, an exemplified form of a magnetic field detecting circuit using such magnetic sensors will be described in the following.

Figure 11:
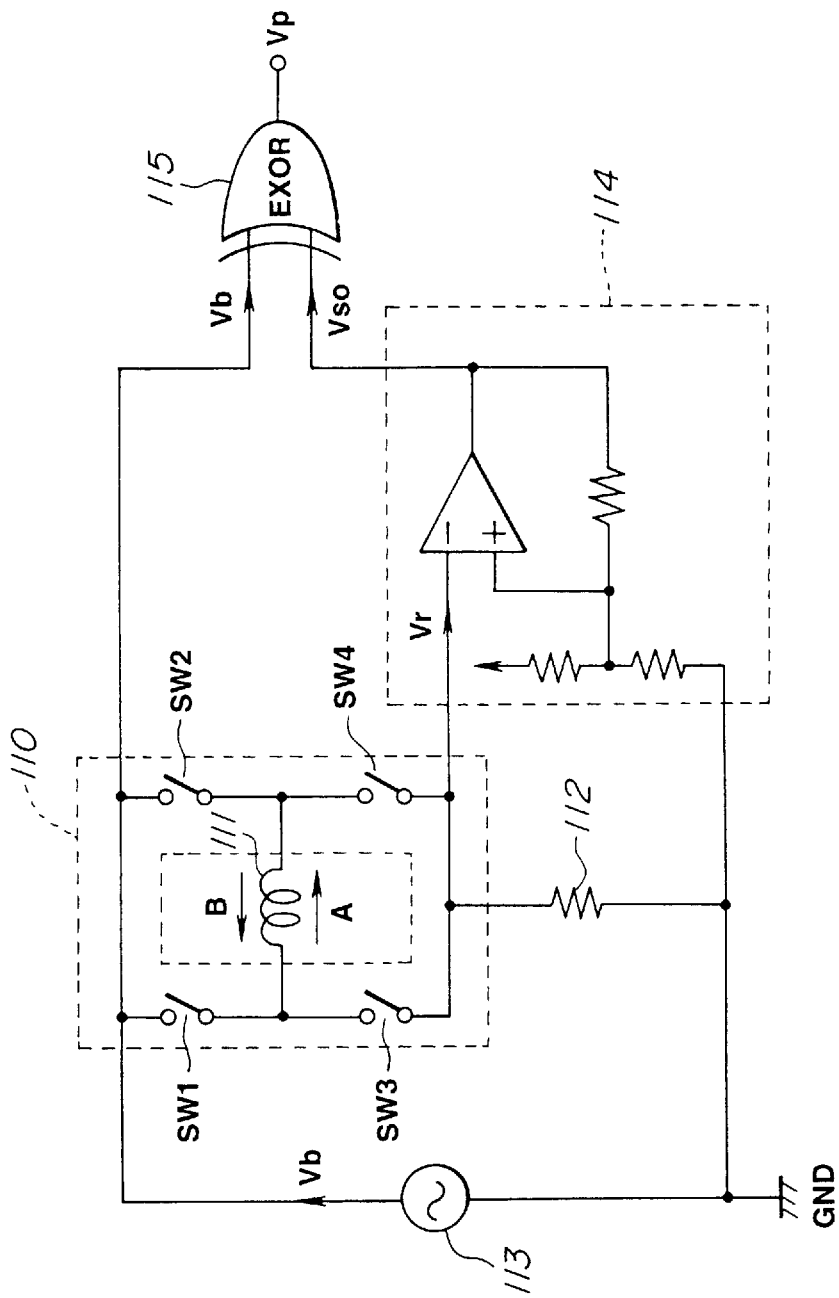
FIG. 11 is a circuit diagram showing an example of a magnetic field detecting circuit to which the present invention is applied.

The magnetic field detecting circuit is provided with, as shown in FIG. 11, a magnetic sensor 111 disposed in a bilateral switch 110, a resistance 112 connected to the bilateral switch 110, a time-varying voltage supply source 113 for supplying square wave-generating voltage Vb to the magnetic sensor ill and the resistance 112, a Schmitt trigger circuit 114 connected to cables led out of both the ends of the resistance 112 and a logic circuit 115 for comparing an output from the Schmitt trigger circuit 114 with oscillating voltage from the oscillating voltage supply source 113.

Herein, the magnetic sensor 111 has a structure in which a coil is wound on a magnetic core, as stated above. The magnetic sensor 111 is provided in the bilateral switch 110 having switches SW1, SW2, SW3 and SW4. The direction of a current supplied to the magnetic sensor 111 can be reversed by the bilateral switch 110 The resistance 112 connected to the bilateral switch 110 is connected in series with the magnetic sensor 111. The resistance 112 and the magnetic sensor 111 constitutes an integrating circuit.

Both the ends of the integrating circuit are connected to the time-varying voltage supply source 113 from which the square wave oscillating voltage Vb is supplied to the integrating circuit so that an integrating current is supplied to the magnetic sensor 111 and the resistance 112.

When the above described integrating current flows to the integrating circuit, the Schmitt trigger circuit 114 connected to the cables led out of both the ends of the resistance 112 detects oscillating voltage Vr generated from the resistance 112 and outputs square wave-generating voltage Vso as a signal based on the response waveform of the oscillating voltage Vr.

Then, the square wave-generating voltage Vso output from the Schmitt trigger circuit 114 is supplied to the logic circuit 115. The square wave oscillating voltage Vb from the time-varying voltage supply source 113 is also supplied to the logic circuit 115. Then, the logic circuit 115 compares the square wave oscillating voltage Vso output from the Schmitt trigger circuit 114 with the square wave-generating voltage Vb output from the time-varying voltage supply source 113 and outputs a pulse voltage signal Vp corresponding to the rise time or the fall time of the oscillating voltage Vr generated in the resistance 112 when the integrating current is supplied to the resistance 112.

Next, an operation of the above described magnetic field detecting circuit will be explained hereinbelow, with reference to FIG. 12 showing the time charts of voltage waveforms in respective parts when the current is supplied to the magnetic sensor 111.

Initially, the square wave-generating voltage Vb is, as shown in FIG. 12A, supplied to the magnetic sensor 111 from the oscillating voltage supply source 113, so that the integrating current is supplied to the integrating circuit including the magnetic sensor 111 and the resistance 112. At this time, the waveform of the oscillating voltage Vr generated in the resistance 112, that is, the waveform of the square wave-generating voltage Vr supplied to the Schmitt trigger circuit 114 becomes, as illustrated in FIG. 12B, a waveform having a delay produced upon its first transition or last transition, relative to the square wave-generating voltage Vb shown in FIG. 12A. In this case, the waveform of the oscillating voltage Vr corresponds to the response waveform of the current supplied to the magnetic sensor 111. Further, the inductance of the coil of the magnetic sensor 111 changes depending on the change of the external magnetic field, and the response waveform of the current supplied to the magnetic sensor 111 changes depending on the change of the inductance. Therefore, the delay of the oscillating voltage Vr during its first transition or last transition changes depending on the magnitude of the external magnetic field which is applied to the magnetic sensor 111.

Thereafter, the Schmitt trigger circuit 114 compares the oscillating voltage Vr shown in FIG. 12B with Schmitt voltage VsH upon its first transition and with Schmitt voltage VsL upon its last transition, outputs the square wave-generating voltage Vso with its waveform shaped as illustrated in FIG. 12C and supplies it to the logic circuit 115.

Then, the logic circuit 115 compares the phase of the square wave-generating voltage Vb supplied from the time-varying voltage supply source 113 with that of the square wave-generating voltage Vso supplied from the Schmitt trigger circuit 114 to have a phase difference and outputs the pulse voltage signal Vp as shown in FIG. 12D.

Herein, the pulse width of the pulse voltage signal Vp represents the rise time or the fall time of the oscillating voltage Vr generated in the resistance 112 when the integrating current is supplied to the integrating circuit including the magnetic sensor 111 and the resistance 112. Since the waveform of the oscillating voltage Vr corresponds to the response waveform of the current flowing in the magnetic sensor 111, the pulse width of the pulse voltage signal Vp output from the logic circuit 115 represents the rise time or the fall time of the current supplied across the magnetic sensor 111. In connection therewith, the rise time or the fall time of the current supplied to the magnetic sensor 111 depends on the magnitude of the external magnetic field, as stated above, the pulse voltage signal Vp output from the logic circuit 115 indicates the magnitude of the external magnetic field applied to the magnetic sensor 111. In other words, in the magnetic field detecting circuit, the magnitude of the external magnetic field is output as the pulse voltage signal Vp from the logic circuit 115.

In the magnetic field detecting circuit, the direction of current supplied across the magnetic sensor 111 can be reversed by means of the bilateral switch 110. Specifically, when the switches SW1 and SW4 are turned on and the switches SW2 and SW3 are turned off in FIG. 11, the current is supplied in the direction shown by an arrow A in FIG. 11. When the switches SW1 and SW4 are turned off and the switches SW2 and SW3 are turned on, the current is supplied in the direction shown by an arrow B in FIG. 11. Thus, the external magnetic field is detected by reversing the direction of the current flowing across the magnetic sensor 111, as mentioned above, by using the bilateral switch 110, so that a higher output can be obtained. In other words, a difference in output between respective current directions is obtained wherein an output twice as much as that obtained when the current is supplied only in a prescribed direction.

Although, in the magnetic field detecting circuit, the change of the inductance of the coil is detected by detecting the change in the response waveform of the current supplied across the coil of the magnetic sensor, it is to be understood that a method for detecting the change of the inductance of the coil is not limited to such a method.

Further, although, according to the above description, the change of the magnetic field is detected based on the change of the inductance of the coil, the change of the magnetic field may be detected based on the change of the impedance of the coil, since the impedance of the coil also changes similarly to the inductance. It will be also recognized that the present is applicable to the case where the change of the magnetic field is detected based on the impedance of the coil as well as the change of the magnetic field is detected based on the change of the inductance.

As apparent from the foregoing description, according to the magnetic sensor of the present invention, since the bias magnetic field caused by the bias current supplied to the coil can be efficiently applied to the magnetic core, the inductance of the coil can be set to a large value without increasing the number of turns of the coil. Therefore, according to the present invention, the magnetic sensor with high efficiency and sensitivity can be provided without increasing the number of turns of the coil.

With the magnetic sensor according to the present invention, since the bias magnetic field due to the bias current supplied to the coil is efficiently applied to the magnetic core, the magnetic core can be completely magnetized even if the bias current is decreased. Therefore, in the magnetic sensor of the invention, a consumed power can be reduced.

Further, when the magnetic sensor according to the invention is employed, since the bias magnetic field owing to the bias current supplied to the coil is efficiently applied to the magnetic core, the number of turns of the coil can be reduced. Then, the number of turns of the coil can be reduced, so that the magnetic sensor can be made compact, and the winding cost is reduced so that a low cost can be realized.

Furthermore, according to the magnetic sensor of the invention, since the number of turns of the coil is reduced to decrease resistance, this magnetic sensor is extremely suitably driven by a low voltage power source, for example, a cell for supplying voltage as low as 3.3 V.

What is claimed is:

1. A magnetic sensor which detects external magnetic fields comprising:

a bobbin having a longitudinal direction along which a diameter of the bobbin varies so that a central portion of the bobbin has a smaller diameter than a remainder of the bobbin;

an elongated magnetic core positioned within the bobbin and extending along the longitudinal direction of the bobbin; and a coil wound on the periphery of said bobbin about at least a central portion of the magnetic core, wherein, the number of turns of the coil along the central portion of the bobbin is greater than that of the coil along the remainder of the bobbin, an outer diameter of a periphery defined by said coil is substantially uniform along the longitudinal direction of said bobbin; and the external magnetic field influences the coil inductance, which influence is detected therein, to detect the external magnetic fields.

2. A magnetic sensor according to claim 1, wherein said coil is wound so as to be thicker between its outer periphery and the center periphery along the central portion of the bobbin than between its outer periphery and the outer periphery of the remaining portion of the bobbin.

3. The magnetic sensor of claim 1, wherein said periphery of said bobbin tapers from an outer end to the central portion so as to impart a concave surface about the outer periphery of the bobbin.

4. The magnetic sensor of claim 1, wherein the periphery of the bobbin has a recessed portion formed in the central portion the bobbin so as to impart a stair step shape to the periphery of the bobbin.

5. A magnetic sensor according to claim 1, wherein said coil is wound only along a central portion of said core, said core thereby having end parts about which said coil is not wound.

6. A magnetic sensor according to claim 5, wherein said bobbin is stepped in profile with said central portion of said bobbin being smaller in diameter than said remaining parts of said bobbin, said central portion being of a uniform diameter, said coil having a uniform thickness about said central portion.

7. A magnetic sensor which detects external magnetic fields comprising:

a bobbin having a longitudinal direction along which a diameter of the bobbin varies so that a central portion of the bobbin has a smaller diameter than a remainder of the bobbin;

an elongated magnetic core positioned within the bobbin and extending along the longitudinal direction of the bobbin; and a coil wound on the periphery of said bobbin about at least a central portion of the magnetic core, wherein, the number of turns of the coil along the central portion of the bobbin is greater than that of the coil along the remainder of the bobbin, an outer diameter of a periphery defined by said coil is substantially uniform along the longitudinal direction of said bobbin, the external magnetic field influences the coil inductance, which influence is detected therein, to detect the external magnetic fields, and said coil is wound so as to be thicker between its outer periphery and the outer periphery along the central portion of the bobbin than between its outer periphery and the outer periphery of the remaining portion of the bobbin.

8. A magnetic sensor which detects external magnetic fields comprising:

a bobbin having a longitudinal direction along which a diameter of the bobbin varies so that a central portion of the bobbin has a smaller diameter than a remainder of the bobbin, said periphery of said bobbin tapering from an outer end to the central portion so as to impart a concave surface about the outer periphery of the bobbin;

an elongated magnetic core positioned within the bobbin and extending along the longitudinal direction of the bobbin; and a coil wound on the periphery of said bobbin about at least a central portion of the magnetic core, wherein, the number of turns of the coil along the central portion of the bobbin is greater than that of the coil along the remainder of the bobbin, an outer diameter of a periphery defined by said coil is substantially uniform along the longitudinal direction of said bobbin, the external magnetic field influences the coil inductance, which influence is detected therein, to detect the external magnetic fields, and said coil is wound so as to be thicker between its outer periphery and the outer periphery along the central portion of the bobbin than between its outer periphery and the outer periphery of the remaining portion of the bobbin.

9. A magnetic sensor which detects external magnetic fields comprising:

a bobbin having a longitudinal direction along which a diameter of the bobbin varies so that a central portion of the bobbin has a smaller diameter than a remainder of the bobbin, the periphery of the bobbin having a recessed portion formed in the central portion so as to impart a stair step shape to the periphery of the bottom;

an elongated magnetic core positioned within the bobbin and extending along the longitudinal direction of the bobbin; and a coil wound on the periphery of said bobbin about at least a central portion of the magnetic core, wherein, the number of turns of the coil along the central portion of the bobbin is greater than that of the coil along the remainder of the bobbin, an outer diameter of a periphery defined by said coil is substantially uniform along the longitudinal direction of said bobbin, the external magnetic field influences the coil inductance, which influence is detected therein, to detect the external magnetic fields, and said coil is wound so as to be thicker between its outer periphery and the outer periphery along the central portion of the bobbin than between the outer periphery and tire outer periphery of the remaining portion of the bobbin.

10. A magnetic sensor according to claim 9, wherein said coil is wound only along a central portion of said core, said core thereby having end parts about which said coil is not wound.

11. A magnetic sensor according to claim 10, wherein said bobbin is stepped in profile with said central portion of said bobbin being smaller in diameter than said remaining parts of said bobbin, said central portion being of a uniform diameter, said coil having a uniform thickness about said central portion.

* * * * *